United States Patent [19]

Mery

[11] Patent Number: 4,729,623

[45] Date of Patent: Mar. 8, 1988

[54] DEVICE FOR CONNECTING AN OPTICAL FIBER AND A PHOTODETECTOR AND METHOD FOR POSITIONING THE LATTER

[76] Inventor: Jean-Paul Mery, 41 rue Cantagrel, 75624 Paris Cedex 13, France

[21] Appl. No.: 620,030

[22] Filed: Jun. 13, 1984

[30] Foreign Application Priority Data

Jun. 14, 1983 [FR] France .................. 83 09815

[51] Int. Cl.$^4$ .............................................. G02B 6/36
[52] U.S. Cl. .................................................. 350/96.20
[58] Field of Search ............. 350/96.15, 96.20, 96.21, 350/96.22; 250/227; 357/17, 30

[56] References Cited

U.S. PATENT DOCUMENTS

| | | | |
|---|---|---|---|
| 4,065,203 | 12/1977 | Goell et al. | 350/96.20 |
| 4,144,504 | 3/1979 | Leggett et al. | 357/74 |
| 4,296,997 | 10/1981 | Malsot et al. | 350/96.20 |
| 4,444,460 | 4/1984 | Stowe | 350/96.19 |
| 4,500,165 | 2/1985 | Scholl et al. | 350/96.20 |
| 4,553,811 | 11/1985 | Becker et al. | 350/96.20 |

FOREIGN PATENT DOCUMENTS 2093631 9/1982 United Kingdom ............ 350/96.20

OTHER PUBLICATIONS

Bailey et al., *Xerox Disclosure Journal*, 4(3), May/Jun. 1979, "Method and Apparatus to Align and Affix an Optical Fiber and Laser or LED," p. 387.
Lynch Jr., *IBM Tech. Disc. Bull.*, 21 (10), Mar. 1979, "Optical Fiber-Waveguide Coupler," p. 4287.

*Primary Examiner*—William L. Sikes
*Assistant Examiner*—Frank González

[57] ABSTRACT

A base member formed as a right dehedron has first and second surfaces on which are respectively secured a plate bearing a photodetector and a platelet bearing an optical fiber end. The position of the fiber endface with respect to a photosensitive surface of the photodetector is checked using an optical magnifier means to observe a spot of a white light beam emitted by the fiber end onto the photosensitive surface. The spot must be concentric with the outline of the photosensitive surface.

21 Claims, 6 Drawing Figures

DEVICE FOR CONNECTING AN OPTICAL FIBER AND A PHOTODETECTOR AND METHOD FOR POSITIONING THE LATTER

BACKGROUND OF THE INVENTION

1. Field of the Invention

This invention relates to a device for connecting an end of an optical fiber and a photodetector, such as a photodiode. Such a connecting device is particularly intended to form an optoelectronic interface at a receiving end of an optical fiber in an optical fiber transmission system. The invention deals further with positioning the end of the optical fiber with respect to a photosensitive surface of the photodetector for maximum reception thereby of a light beam transmitted by the fiber.

2. Description of the Prior Art

International Patent Application No. WO 79/00099 discloses such a connecting device as comprising a U-shaped base member. A tip of a first arm of the base member carries an opto-electronic element, e.g., a a photodetector. Freely running through a hole in another arm of the base member is a bushing with a flange pressed against the base member by a spring. A sleeve solidly enveloping an optical fiber end slidably fits inside the bushing.

A micromanipulator positions an endface of the fiber end opposite an active surface of the opto-electronic element. The micromanipulator comprises a frame with a slider to which the base member is secured to move the opto-electronic device in a direction normally parallel to an axis of the fiber end. A chuck gripping sleeve is moved in two directions orthogonal to the axis of the fiber end by adjusting screws fixed to the frame.

The desired position of the fiber end with respect to the opto-electronic element is checked using conventional measurements of electrical power picked up by the photodetector from a light beam emitted through the fiber end. The desired position is fixedly maintained by bonding the sleeve inside the bushing, thereby fixing the position of the fiber end in an axial direction, and then by bonding the bushing flange to the second arm of the base member. The connecting device is then ready for use after separating the base member and the slider and after separating the sleeve and chuck.

The connecting device described in International Patent Application No. WO 79 00099 requires a special micromanipulator and other highly special members as well as many assembly and dismantling operations that result in a relatively high manufacturing cost of the device. Additionally, the positioning operation requires a biasing and amplifying circuit matched with the specific characteristics of the photodetector. Because the distance from the photosensitive surface of the photodetector to the endface of the fiber end must be on the order of a few hundredths of a millimeter, movement of the slider could result in hard contact between the fiber endface and the photosensitive surface thereby causing damage thereto.

OBJECTS OF THE INVENTION

The main object of this invention is to provide a device for connecting an optical fiber and a photodetector that overcomes the aforesaid drawbacks.

Another object of this invention is to permit a quick manual positioning of an optical fiber endface with regard to a photosensitive surface of a photodetector.

A further object of this invention is to provide a method for positioning an end of an optical fiber with respect to a photodetector with the aid of optical measuring means usable for any type of photodetector.

SUMMARY OF THE INVENTION

These and other objects of this invention are accomplished through a device for connecting an end of an optical fiber to photosensitive means, the fiber end having an endface opposite a photosensitive surface of the photosensitive means, said device comprising a first flat means for bearing the fiber end, and a base member shaped as a right dihedron having first and second surfaces, the first bearing means being secured on the first dihedron surface and said photosensitive means being secured on the second dihedron surface. The surfaces of the dihedron are advantageously employed as reference surfaces to position quickly the photosensitive means firstly by sight and manually in order that it be secured to the second dihedron surface, and then by placing the first bearing means on the first dihedron surface substantially opposite the photosensitive surface.

The photosensitive means advantageously comprises a second flat means, such as a rectangular plate having a rectilinear edge, for bearing a photodetector. The rectilinear edge is spaced from a center of the photosensitive surface of the photodetector by a distance substantially greater by a few hundredths or tenths of the millimeter than a distance between an axis of the optical fiber end and a face of the first bearing means such as a platelet carrying the fiber end and pressable against the first dihedron surface. By pressing the rectilinear edge against the first dihedron surface prior to securing the plate and by pressing the platelet against the first dihedron surface, it is possible to position the endface of the fiber end by sight substantially in line with the photosensitive surface. The first beaming means is then quickly moved through a few hundredths or tenths of a millimeter using a conventional micromanipulator to position the axis of the fiber end colinearly with the center of the photosensitive surface. These conditions contribute advantageously to positioning the optical axis of the fiber end with respect to the photosensitive surface center in terms of the thickness of a fine boundary layer between the first bearing means and the first dihedron surface when the first bearing means is later secured to the dihedron.

A method for positioning the endface of the fiber end with respect to the photosensitive surface of the photosensitive means comprises the following steps:

(a) securing the plate to the second dihedron surface of the dihedron whereby the center of the photosensitive surface of the photodetector is at a height above the first dihedron surface equal to or substantially greater than a predetermined distance between the axis of the fiber end and the face of the platelet applicable against the first dihedron surface;

(b) aiming an optical magnifying means towards the photodetector center;

(c) injecting a white light beam into the fiber so it is emitted by an endface of the fiber end;

(d) moving platelet in three mutually orthogonal directions with a micromanipulator to position the fiber endface to within a few hundredths of a millimeter of the photosensitive surface and orientating the fiber endface to an ideal location such that a spot formed by the white light beam on the photosensitive surface and observed through the optical magnifying means is concentric with said photosensitive surface; and (e) the platelet at said ideal location is secured onto the first dihedron surface.

The optical magnifying means, such as a binocular magnifying-glass or a binocular microscope, may be used regardless of dimensional and functional characteristics of the photodetecting means, A conventional micromanipulator with no modification whatsoever can be utilized for displacing the platelet.

BRIEF DESCRIPTION OF THE DRAWING

Further advantages and features of this invention will be more fully appreciated from the following detailed description of several embodiments of the invention with the reference to the corresponding accompanying drawings, in which.

DESCRIPTION OF THE PREFERRED EMBODIMENTS

Figure 1A:
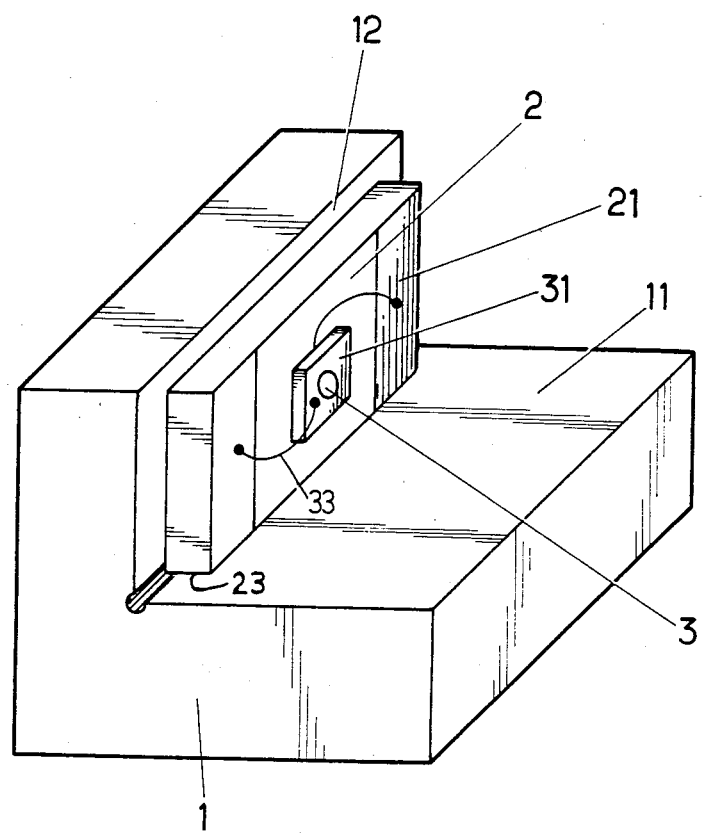
FIGS. 1A and 1B are two perspective views of a connecting device embodying the invention, with a photodetector already in position and an end of an optical fiber in the process of being positioned, respectively.
Figure 1B:
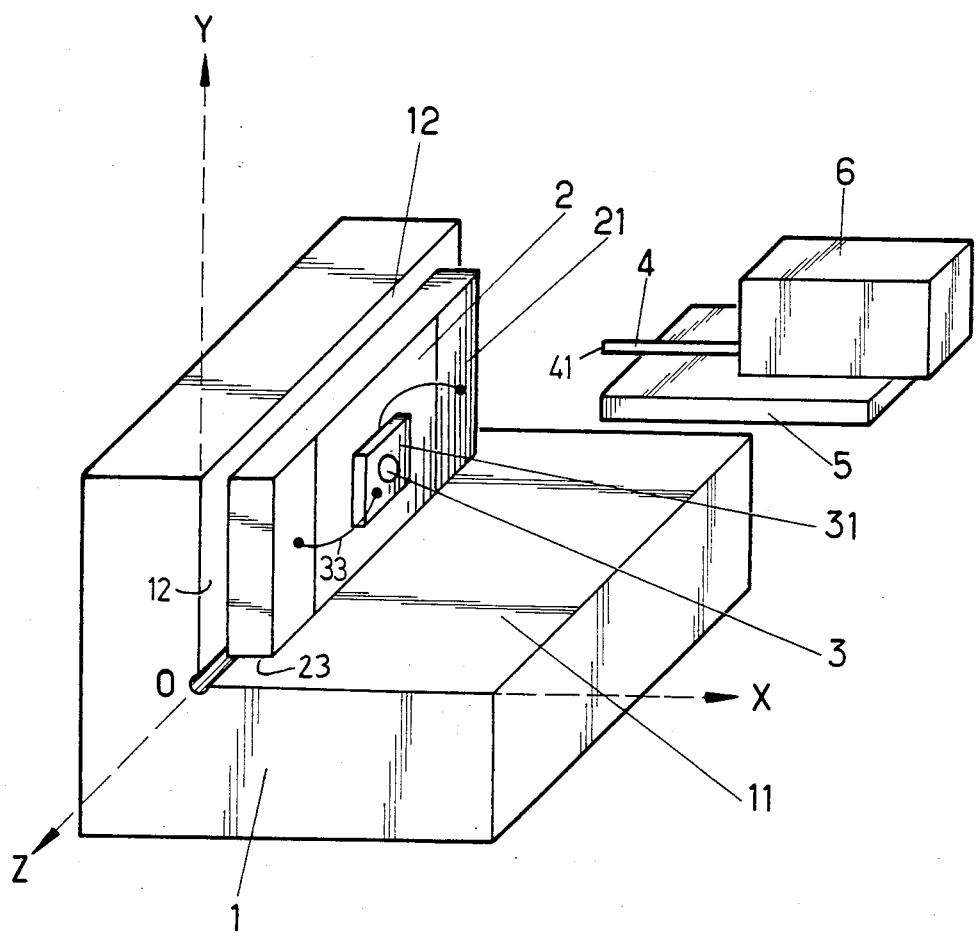

With reference to FIGS. 1A and 1B, a connecting device embodying the invention comprises a base member 1 formed as a right dihedron, having perpendicular planar surfaces 11 and 12 respectively coplanar with horizontal and vertical planes XOZ and YOZ. Planes XOZ and YOZ thus define an orthogonal reference frame; the planes intersect at axis OZ that defines an edge of the dihedron.

A photosensitive means comprises a small rectangular flat substrate 31 and a photodetector, such as photodiode 3, embedded in a vertical face of substrate 31. A photosensitive surface of photodiode 3 is formed as a circular disc, encircled by metal-plated circular ring 32 forming one of two terminals of the photodiode, as depicted in detail in FIGS. 3A and 3B. Substrate 31 is secured against a vertical side of a diode-holder 2, configured as a rectangular ceramic plate. Two vertical strips 21 of diode-holder 2 are metal-plated on either side of substrate 31 to provide accessible electrical contacts linked to the terminals of photodiode 2 by two soldered conductive straps 33. Another vertical side of diode-holder 2 is bonded against vertical surface 12 of dihedron 1. Preferably, the final position where diode-holder 2 stands against surface 12 is adjusted manually by pressing a rectilinear edge 23 of diode-holder 2 suitably ground against first surface 11 whilst the bonding agent on surface 12 cures. In this case, a centre C of photodiode 3 is located above horizontal surface 11 of the dihedron at a predetermined height $Y_o$, or preferably at a distance a few hundredths or tenths of a millimeter higher than the height $Y_o$. The height $Y_o$ is defined infra. In a further embodiment, the final position of diode-holder 2 is obtained using a micromanipulator with a reference table accommodating base member 1.

The horizontal surface 11 of the dihedron is a reference surface for positioning one end of optical fiber 4. As depicted in FIG. 1B, an end of fiber 4 is positioned opposite photodiode 3, there being a rigid hold thereon to obtain precise positioning. The end of the optical fiber has a degree of elasticity that is far from being compatible with precise positioning. The present invention encompasses a means for stiffening the end of fiber 4 by reinforcing said fiber with a flat fiber holder 5, such as a rectangular ceramic platelet rectilinearly carrying the end of fiber 4.

A horizontal major face of fiber-holder 5 is coated with bonding agent and accommodates an end of fiber 4, preferably disposed colinearly with a major axis of fiber-holder 5. Endface 41 on the end of fiber 4 designated to be opposite photodiode 3 protrudes a few millimeters over a small edge of fiber-holder 5 laid parallel to surface 12. Fiber-holder 5 has a thickness chosen such that the distance between the axis of the end of fiber 4 and an opposite uncoated major face of fiber-holder 5 is equal to $Y_o$, FIG. 3A. A sleeve 6, FIG. 2, such as a grooved block, is pressed against the bonding-coated surface of fiber-holder 5 to cover a small section of fiber 4 short of endface 41.

Figure 2:
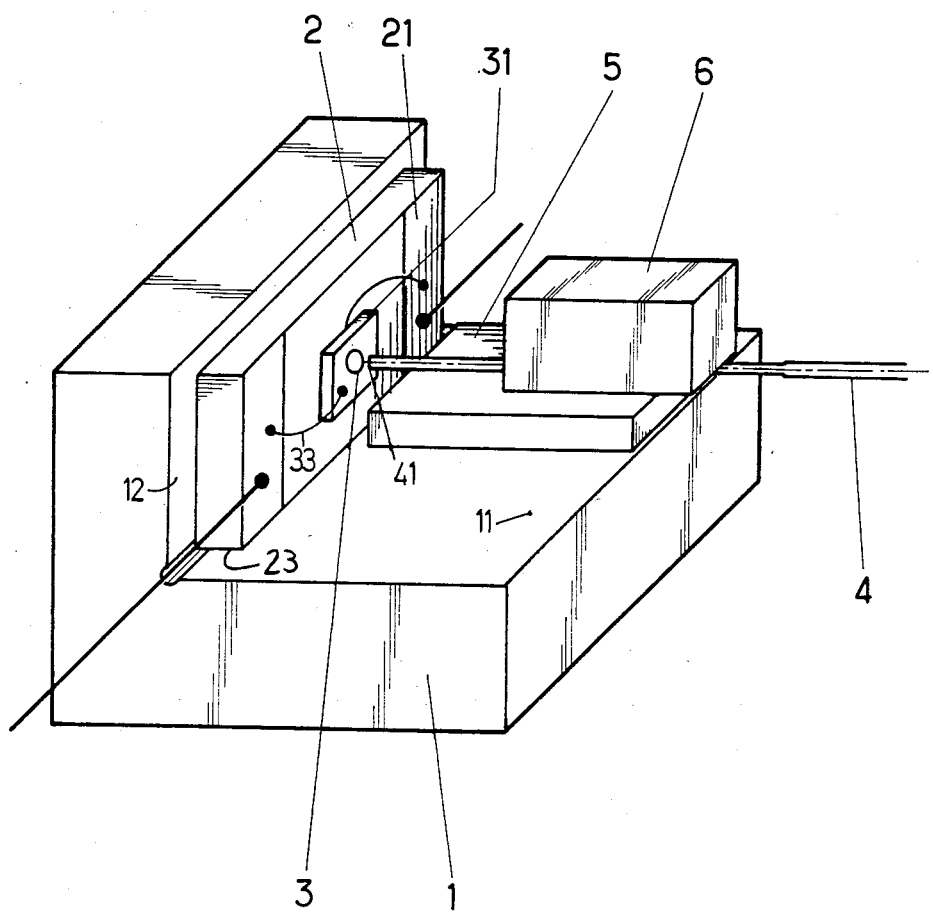
FIG. 2 is a perspective view of the connecting device; after the fiber end has been positioned.

Sleeve 6 is manually gripped, and fiber-holder 5 is pressed against and slidably pushed along first surface 11 of dihedron 1 for orientating the end of fiber 4 by sight substantially perpendicularly to the photosensitive surface of photodiode 3 and for positioning endface 41 of fiber 4 to within a few hundredths of a millimeter from the photosensitive surface of photodiode 3, as shown in FIG. 2. The axis of fiber end is at a distance $Y_o$ from surface 11 and substantially below center C of the photodiode by a few hundredths or tenths of a millimeter.

The positioning of endface 41 of fiber 4 is then perfected using a micromanipulator comprising a clamp or vice jaws that grip the longitudinal edges of sleeve 6 and thus move fiber-holder 5 in a three-dimensional space above surface 11. The micromovements of fiber-holder 5 are monitored by an optical magnifying means so that the axis of the fiber end is perfectly perpendicular to the photosensitive surface and runs through the center C thereof. Movement along the vertical axis OY to position the axis of the fiber end in a horizontal plane running through the center C of photodiode 3 is achieved quickly, since the axis of the optical fiber end is initially at a distance $Y_o$ above surface 11 and off-set by a few hundredths or tenths of a millimeter from the center C.

Figure 3A:
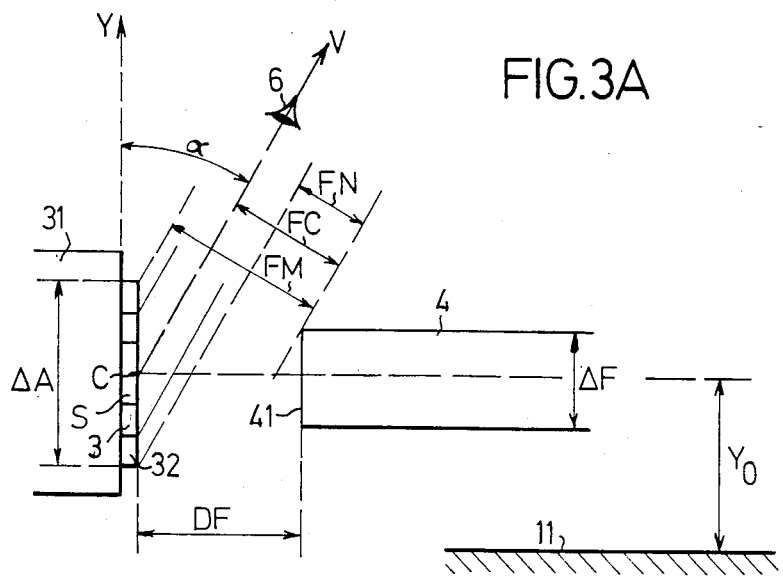
FIGS. 3A, 3B and 3C are schematic side views respectively depicting the direction for observing the photodetector and fiber end connection, the connection seen using a binocular microscope along the observation direction, and an image of the fiber end reflected by a substrate bearing the photodetector.
Figure 3B:
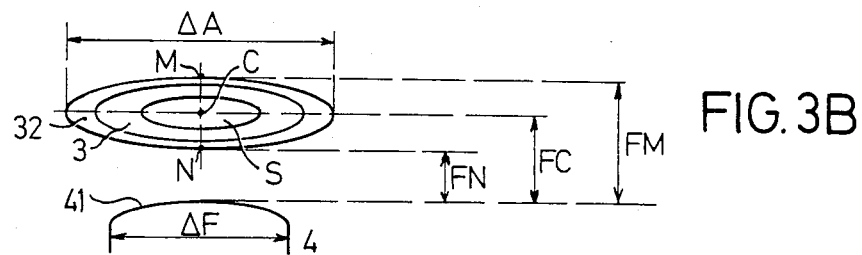

The optical magnifying means includes a stereoscopic binocular microscope 6, FIG. 3A located above surface 11; alternatively the magnifier may be a binocular magnifying-glass. Optical axis V of microscope 6, directed towards photodiode 3 and fiber endface 41, preferably lies parallel to the vertical plane XOY, forms a sighting angle $\alpha$ with the vertical plane YOZ parallel to the photosensitive surface of the photodiode. A circular outline around photodiode 3 is identifiable by metal-plated ring 32 that is viewed in binocular microscope 6 as an elliptical ring, as shown in FIG. 3B. The perimeter of the ellipitical ring has a major axis parallel to the axis OZ and equal to diameter $\Delta A$ of ring 32 and a minor axis MN parallel to the plane XOY. The endface 41 of fiber 4 is viewed as a half-ellipse at distances FN, FC and FM from the lower vertex N of the minor axis, the center C and the upper vertex M of the minor axis of the elliptical ring, respectively.

Figure 3C:
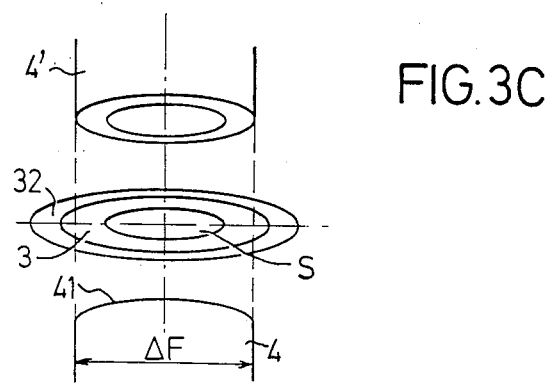

A beam of white light injected into fiber 4 is emitted from endface 41 of the fiber to forms spot S, FIG. 3C, on the photosensitive surface of photodiode 3. By observing the shape of the spot S and the location thereof with respect to ring 32, it is possible to position the end of fiber 4 at an ideal location as required. The ideal location corresponds to spot S having a visible elliptical outline perfectly concentric with the elliptical ring observed through binocular microscope 6. The ideal location is sought by moving fiber-holder 5 with the aid of the micromanipulator. Such movement is essentially carried out parallel to the reference plane X0Z defined by dihedron surface 11. Only very slight movement of fiber-holder 5 along the direction OY is required since the optical axis of the fiber end is already just a few hundredths or tenths of a millimeter from surface 11. These few hundredths or tenths of a millimeter correspond to the difference between the distance of the photodiode center C and the height $Y_o$ and take into account a the thickness of the bonding agent that is to secure fiber-holder 5 to surface 11.

After having identified the ideal location for the fiber end using measurement means in the micromanipulator, fiber-holder 5 is withdrawn. Surface 11 is coated with bonder. Fiber-holder 5 is then repositioned on the ideal location as above-identified and held there by the bonding agent.

In a further embodiment, fiber-holder 5 is made of metal, e.g. aluminium, copper or brass, and is bonded and/or welded to surface 11 of base member 1. The aforementioned materials, including ceramic, undergo no deformation during curing of the bonder nor during welding.

The device for connecting an optical fiber and a photodetector thus obtained is an integral unit and offers all the qualities necessary for withstanding any thermal and mechanical stress encountered during use and remains compatible with straightforward productionization.

In a further embodiment of the positioning method, the ideal location for the end of fiber 4 is verified by lining up an image 4' of the fiber end with respect to the plane of the photosensitive surface of photodiode 3, as depicted in FIG. 3C. Indeed, substrate 31 of photodiode 3 is semi-reflective. The desired alignment of fiber 4 is achieved when edges of the end of fiber 4 are viewed as being aligned with conjugate edges of its image 4'.

In a further embodiment, surface 12 against which diode-holder 2 is bonded, or diode-holder 2 itself is a printed circuit board carrying discrete and/or integrated electronic components forming a hybrid circuit. The hybrid circuit electrically biases the photodiode and preamplifies an electrical signal obtained through optical-electrical conversion of an optical signal transmitted by the end of fiber 4 to the photodiode 3. The ideal location for the end of optical fiber 4 is determined directly or is checked following positioning by using binocular microscope 6 whereupon a measurement is taken of the power of an electrical signal derived from the hybrid circuit. The ideal location corresponds to the maximum power in the electrical signal.

Moreover, use of the binocular microscope provides a means of accurately measuring the position of endface 41 on the end of fiber 4 with respect to the photosensitive surface of photodiode 3. With reference to FIGS. 3A and 3B, the distance DF between fiber endface 41 and the photosensitive surface of photodiode 3 is deduced from one of the three equations below in terms of the distance FM, FC and FN measured using two crosswires included in eyepieces of the microscope and in terms of predetermined outside diameters $\Delta A$ and $\Delta F$ of circular ring 32 and fiber end 4 and the predetermined sighting angle $\alpha$.

(1) $DF \cos \alpha = FM - (\Delta A/2) \sin \alpha + (\Delta F/2) \sin \alpha$ or $DF = FM/(\cos \alpha) + (\Delta F - \Delta A)(\tan \alpha)/2$ (2) $DF \cos \alpha = FC + (\Delta F/2) \sin \alpha$ or $DF = FC/(\cos \alpha) + (\Delta F \cdot \tan \alpha)/2$ (3) $DF \cos \alpha = FN + (\Delta A/2) \sin \alpha + (\Delta F/2) \sin \alpha$ or $DF = FN/(\cos \alpha) + (\Delta F + \Delta A)(\tan \alpha)/2$ It is further possible to avoid taking distance measurements by positioning the end of fiber 4 such that the distance FM, FC, FN in the respective foregoing equation is zero. The real distance DF between photodiode 3 and fiber endface 41 is then expressed by one of the following equations respectively:

$DF = (\Delta F - \Delta A)(\tan \alpha)/2$
$DF = (\Delta F \cdot \tan \alpha)/2$
$DF = (\Delta F + \Delta A)(\tan \alpha)/2$ When the distance FM equals zero, if diameter $\Delta F$ of the end of fiber 4 is less than diameter $\Delta A$ of the elliptical ring, the distance DF is negative, thereby indicating that the fiber end is too close to the photodiode and that the fiber end and the photodiode are damaged. As a result, positioning the fiber end to obtain a distance FM equal to zero is only carried out when the diameter $\Delta F$ of the fiber is equal to or greater than the outside diameter $\Delta A$ of ring 32.

In a further embodiment for measuring the distance, two homologous points on the edges of fiber 4 and its image 4' are marked off to deduce the distance DF. Such a measurement is applicable to an endface 41 of a lensed or broken fiber.

What I claim is:

1. A device for connecting an end of an optical fiber to a photodetector, said fiber end having an endface opposite an active surface of said photodetector, said device comprising a first flat means for bearing said fiber end, a base member shaped as a right dihedron having first and second mutually orthogonal surfaces, said first bearing means being secured on said first dihedron surface and said photodetector being secured on said second dihedron surface, and second flat means secured to said second dihedron surface for bearing said photodetector.

2. The device claimed in claim 1 wherein said active surface is parallel to said second dihedron surface, and said fiber end is perpendicular to said first dihedron surface.

3. The device claimed in claim 1 wherein said first bearing means comprises a platelet having a face to which said fiber end is bonded, and another face secured to said first dihedron surface.

4. The device claimed in claim 3 wherein said endface of said optical fiber end protrudes over said platelet.

5. The device claimed in claim 3 wherein said platelet is bonded to said first dihedron surface.

6. The device claimed in claim 3 wherein said platelet is welded to said first dihedron surface, said platelet being made of ceramic material.

7. The device claimed in claim 3 wherein said platelet is made of metal such as aluminium, copper and brass, said first bearing means comprising gripping means covering a section of said fiber end and bonded to said platelet.

8. The device claimed in claim 1 wherein said second bearing means is bonded to said second dihedron surface.

9. The device claimed in claim 8 wherein said second bearing means has a rectilinear edge in press contact with said first dihedron surface, said second bearing means comprising conductive strips connected to terminals of said photodetector by conductive straps.

10. The device claimed in claim 9 wherein said first bearing means comprises a platelet having a face to which said fiber end is bonded, and another face secured to said first dihedron surface and wherein a center of said surface of said photodetector is located with respect to said rectilinear edge at a distance greater by a few tenths of a millimeter than the distance between an axis of said optical fiber end and said platelet face securable to said first dihedron surface.

11. The device claimed in claim 1 wherein said second bearing means is a printed and/or multilayered circuit board carrying discrete and/or integrated electronic components.

12. The device claimed in claim 1 wherein said second dihedron surface is a printed and/or multilayered circuit board carrying discrete and/or integrated electronic components.

13. A device for connecting an end of an optical fiber to an opto-electronic device, said fiber end having an endface opposite an active surface of said opto-electronic device, said device comprising a first flat support member bearing said fiber end, a second flat support member bearing said opto-electronic device, and a base member shaped as a right dihedron having first and second surfaces, said first and second support members being secured on said first and second dihedron surfaces respectively, and said active surface and said fiber endface being parallel to said second dihedron surface.

14. The device claimed in claim 13, wherein said second support member has a rectilinear edge applied against said first dihedron surface and located with respect to a center of said active surface at a predetermined distance, and said first support member has a predetermined flat face bonded on said first dihedron surface, said predetermined distance being equal to the sum of the distance between an axis of said fiber end and said predetermiend face of said first support member, and a bonding agent having an adjustable thickness between said predetermined face of said first support member and said first dihedron surface.

15. A method of positioning an end of an optical fiber secured on a first flat support member with respect to photosensitive means secured on a second flat support member by a base member shaped as a right dihedron having first and second orthogonal surfaces, said method comprising the following steps:

(a) securing said second support member to said second dihedron surface whereby a center of a photosensitive surface of said photosensitive means is at a height above said first dihedron surface equal to or substantially greater than a predetermined distance between an axis of said fiber end and a face of said first support member applied against said first dihedron surface;

(b) aiming the optical axis of an optical magnifying means towards said center of said photosensitive means;

(c) supplying a white light beam to said fiber so it is emitted by an endface of said fiber end;

(d) moving said first support member in three directions by means of a micromanipulator to position said fiber endface to within a few hundredths of a millimeter of said photosensitive surface and orientate said fiber endface to an ideal location such that a spot formed by said white light beam on said photosensitive surface and observed through said optical magnifying means is concentric with said photosensitive surface; and (e) securing said first support member at said ideal location to said first dihedron surface.

16. The method claimed in claim 15 further comprising press contacting a rectilinear edge of said second support member with said first dihedron surface before said second member is secured to said second dihedron surface.

17. The method claimed in claim 15 wherein said photosensitive surface is surrounded by metal-plated ring, and further comprising checking the position of said endface of said fiber end at said ideal location with said optical magnifying means, and adjusting the position of the fiber endface so said spot is observed during the checking step as presenting an elliptical outline concentric with an elliptical ring representing observation of said metal-plated ring.

18. The method claimed in claim 15 further including checking the position of said endface of said fiber end at said ideal location with said optical magnifying means, and adjusting the position of the fiber end so edges of said fiber end are observed during the checking step as being aligned with conjugate edges of an image of said fiber end reflected by said photosensitive surface.

19. The method claimed in claim 15 wherein said checking step is performed with a binocular microscope.

20. The method claimed in claim 15 wherein said checking step is performed with a binocular magnifying-glass.

21. The method claimed in claim 15 further including measuring distances between characteristic points on said endface of said fiber end and said photosensitive surface with the aid of cross-wires included in eyepieces of said optical magnifying means.

* * * * *